US008901801B2

(12) United States Patent
Schneider et al.

(10) Patent No.: US 8,901,801 B2
(45) Date of Patent: Dec. 2, 2014

(54) MULTIPLE ELECTRODE PLANE WAVE GENERATOR

(75) Inventors: John K. Schneider, Snyder, NY (US); Jack C. Kitchens, Tonawanda, NY (US)

(73) Assignee: Qualcomm Incorporated, San Diego, CA (US)

( * ) Notice: Subject to any disclaimer, the term of this patent is extended or adjusted under 35 U.S.C. 154(b) by 22 days.

(21) Appl. No.: 13/150,432

(22) Filed: Jun. 1, 2011

(65) Prior Publication Data

US 2011/0291531 A1 Dec. 1, 2011

Related U.S. Application Data

(60) Provisional application No. 61/350,248, filed on Jun. 1, 2010.

(51) Int. Cl.
*H01L 41/08* (2006.01)
*B06B 1/06* (2006.01)

(52) U.S. Cl.
CPC .................................... *B06B 1/0611* (2013.01)
USPC ............ 310/334; 310/339; 310/335; 310/337

(58) Field of Classification Search
USPC ......... 310/334, 335, 336, 337, 327, 365–367, 310/800; 73/803; 348/61; 382/124, 125
See application file for complete search history.

(56) References Cited

U.S. PATENT DOCUMENTS 3,904,274 A * 9/1975 Feinleib et al. ............... 359/295
5,258,922 A * 11/1993 Grill ............................. 702/167
7,400,750 B2 * 7/2008 Nam ............................... 73/620
2005/0110103 A1 * 5/2005 Setlak ........................... 382/124
2007/0176710 A1 * 8/2007 Jamneala et al. ............. 333/191
2007/0236106 A1 10/2007 Koc et al.
2007/0258628 A1 * 11/2007 Schneider et al. .............. 73/620
2008/0122317 A1 * 5/2008 Fazzio et al. .................. 310/328
2009/0048519 A1 2/2009 Hossack et al.
2010/0052478 A1 * 3/2010 Schneider et al. ............ 310/334

OTHER PUBLICATIONS

International Search Report and Written Opinion from the International Searching Authority for PCT/US2011/038687, Sep. 12, 2011, Ultra-Scan Corporation.

* cited by examiner

*Primary Examiner* — Thomas Dougherty
*Assistant Examiner* — Karen B Addison
(74) *Attorney, Agent, or Firm* — Hodgson Russ LLP

(57) ABSTRACT

The invention may be embodied as an ultrasonic plane wave generator having a first sheet of piezoelectric material and a second sheet of piezoelectric material. A shared electrode may be between the first sheet and the second sheet. A first electrode set may have a plurality of electrodes, and these electrodes may be positioned with respect to the first sheet to form a set of wave generators. A wave generator in this first wave generator set may include the shared electrode, the first sheet, and one of the electrodes in the first electrode set. A second electrode set may have a plurality of electrodes, and these electrodes may be positioned with respect to the second sheet to form another set of wave generators. A wave generator in this second wave generator set may include the shared electrode, the second sheet, and one of the electrodes in the second electrode set.

19 Claims, 4 Drawing Sheets

Fig. 1A (PRIOR ART)
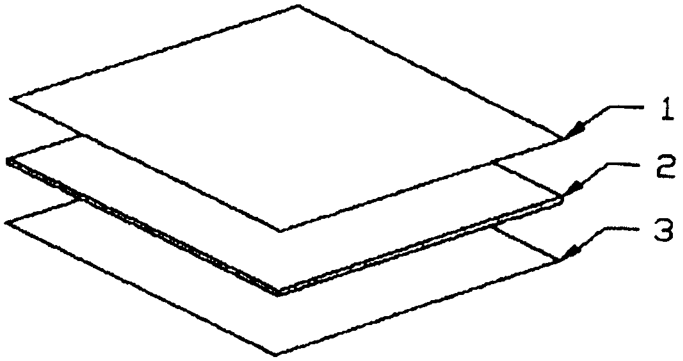
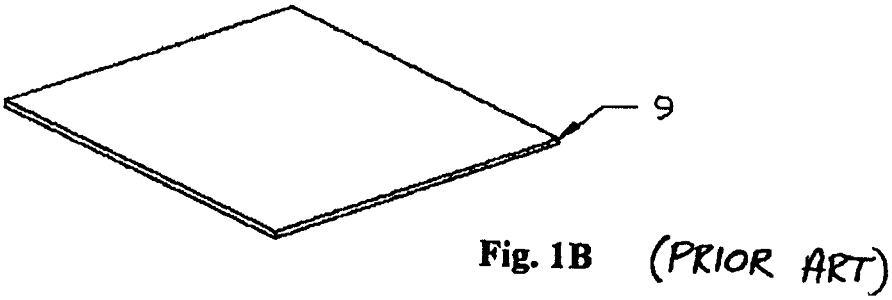
Fig. 1B (PRIOR ART)

Fig. 2A
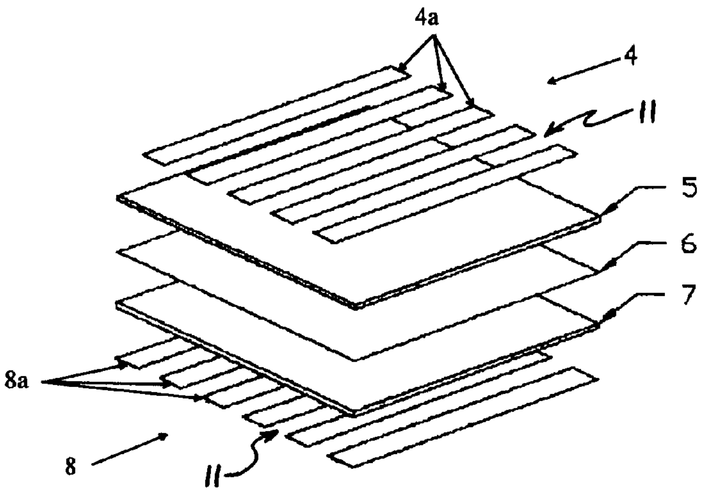
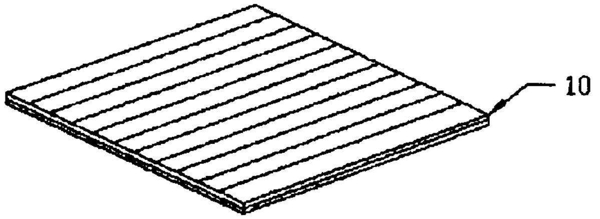
Fig. 2B
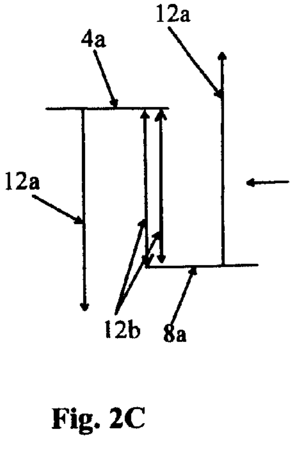
Fig. 2C
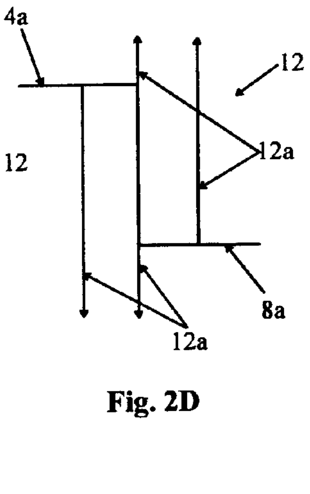
Fig. 2D
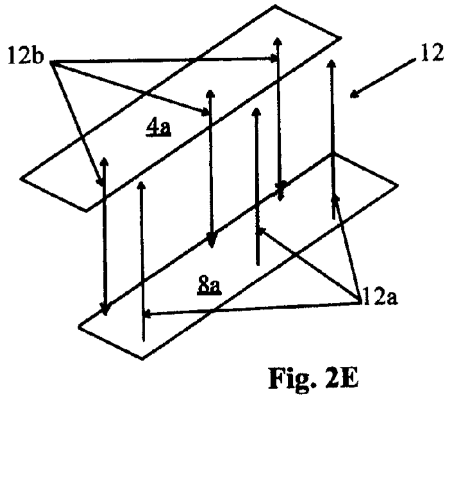
Fig. 2E

MULTIPLE ELECTRODE PLANE WAVE GENERATOR

CROSS-REFERENCE TO RELATED APPLICATIONS

This application claims the benefit of priority to U.S. provisional patent application Ser. No. 61/350,248, filed on Jun. 1, 2010, which is incorporated herein by reference in its entirety.

FIELD PF THE INVENTION

The present invention relates to an ultrasonic wave generator, and specifically to a reflex ultrasonic imaging system having a plurality of individual wave generators.

BACKGROUND OF THE INVENTION

Some existing reflex ultrasonic imaging systems make use of a pulse-generating system that has a plane wave generator. A prior art embodiment of a plane wave generator 9 is shown schematically in FIGS. 1A and 1B. FIG. 1A depicts components of the plane wave generator 9. There it is shown a sheet of piezoelectric material 2 positioned between an upper electrode 1 and a lower electrode 3. The plane wave generator 9 produces a longitudinal wave that insonifies an object that is in contact with an imaging platen. By detecting the energy reflected by the object, information about the object may be obtained. The information may be processed by a computer to provide a visual representation of the object via a monitor.

Piezoelectric devices can be used as plane wave generators, and they typically include piezoelectric ceramics, piezoelectric crystals or piezoelectric polymers. To an electronic system that supplies power to the plane wave generator, the plane wave generator looks like a low impedance electrical load. The driving circuits required for such low impedance loads must deliver more power than the driving circuits for high impedance devices.

SUMMARY OF THE INVENTION

The invention may be embodied as an ultrasonic plane wave generator having a first sheet of piezoelectric material and a second sheet of piezoelectric material. A shared electrode may be between the first sheet and the second sheet. A first electrode set may have a plurality of electrodes, and these electrodes may be positioned with respect to the first sheet to form a set of wave generators. A wave generator in this first wave generator set may include the shared electrode, the first sheet, and one of the electrodes in the first electrode set. A second electrode set may have a plurality of electrodes, and these electrodes may be positioned with respect to the second sheet to form another set of wave generators. A wave generator in this second wave generator set may include the shared electrode, the second sheet, and one of the electrodes in the second electrode set.

Adjacent electrodes of the first electrode set may be separated from each other. Adjacent electrodes of the second electrode set may be separated from each other. In such an embodiment of the invention, in order to insonify an object that is being imaged, the electrodes of the second electrode set may be positioned so as to emit energy toward an object so that the energy travels primarily through the gaps between the electrodes of the first electrode set.

Each electrode in the first electrode set may have one or more surface normals which define a surface of that electrode, and each electrode in the second electrode set may have one or more surface normals which define a surface of that electrode. In one embodiment of the invention, electrodes in the first electrode set may be positioned relative to the electrodes in the second electrode set so that surface normals of the subset of electrodes in the first electrode set are not coincident with surface normals of the electrodes in the second electrode set. In such an arrangement, the electrodes are said to be non-overlapping. In another embodiment, electrodes in the first electrode set may be positioned relative to electrodes of the second electrode set to provide overlapping areas in which surface normals of electrodes in the first electrode set are coincident with surface normals of electrodes in the second electrode set.

At least one of the wave generators in the first wave generator set may be individually activatable. Additionally, at least one of the wave generators in the second wave generator set may be individually activatable. In this manner, some of the wave generators can be activated while others of the wave generators are not activated.

BRIEF DESCRIPTION OF THE DRAWINGS

For a fuller understanding of the nature and objects of the invention, reference should be made to the accompanying drawings and the subsequent description. Briefly, the drawings are:

FIG. 1A is an exploded schematic view of a prior art ultrasonic plane wave generator with a piezoelectric material between two electrodes;

FIG. 1B shows the unexploded view of the device depicted in FIG. 1A;

FIG. 2A is an exploded schematic view of an ultrasonic plane wave generator that is in keeping with the invention;

FIG. 2B shows an unexploded view of the device depicted in FIG. 2A;

FIG. 2C depicts electrodes arranged according to the invention in which there are overlapping portions;

FIG. 2D depicts electrodes arranged according to the invention so as not to have an overlapping portion;

FIG. 2E is a perspective view of the electrode arrangement depicted in FIG. 2C;

FIG. 3C is a side view showing the device of FIG. 3B in unexploded form; and.

DETAILED DESCRIPTION OF THE INVENTION

Figure 3B:
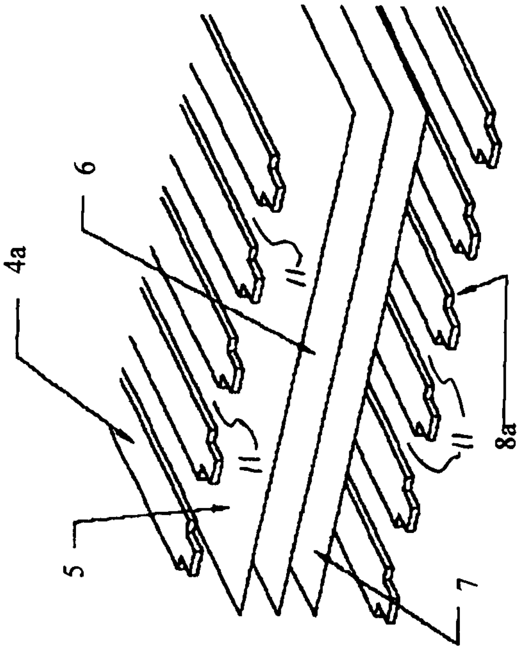
FIG. 3B is an exploded partial perspective view of a device that is in keeping with the invention.

FIGS. 2A and 2B depict an embodiment of the invention. In FIGS. 2A and 2B, there is a multiple electrode plane wave generator 10, which may be constructed by sandwiching a thin continuous electrode 6 between two sheets of piezoelectric material 5, 7. A first electrode set 4 may have a plurality of electrodes 4*a*, and these electrodes may be positioned with respect to a first sheet of piezoelectric material 5 to form a set of wave generators. A wave generator in this first wave generator set includes the continuous electrode 6, the first sheet 5, and one of the electrodes in the first electrode set 4*a*. A second electrode set 8 may have a plurality of electrodes 8*a*, and these electrodes may be positioned with respect to the second sheet 7 to form another set of wave generators. A wave generator in this second wave generator set includes the shared electrode 6, the second sheet 7, and one of the electrodes in the second electrode set 8*a*. Each wave generator in the first or second generator set may be individually activatable.

FIG. 2A depicts an exemplary embodiment of the invention where the first set of electrodes 4 is applied to the first sheet of piezoelectric material 5, the second set of electrodes 8 is applied to the second sheet of piezoelectric material 7, and the continuous electrode 6 is applied between the first sheet 5 and second sheet 7. However, the sheets 5, 7 do not necessarily need to be applied directly to the first set 4, second set 8, or continuous electrode 6.

Figure 3A:
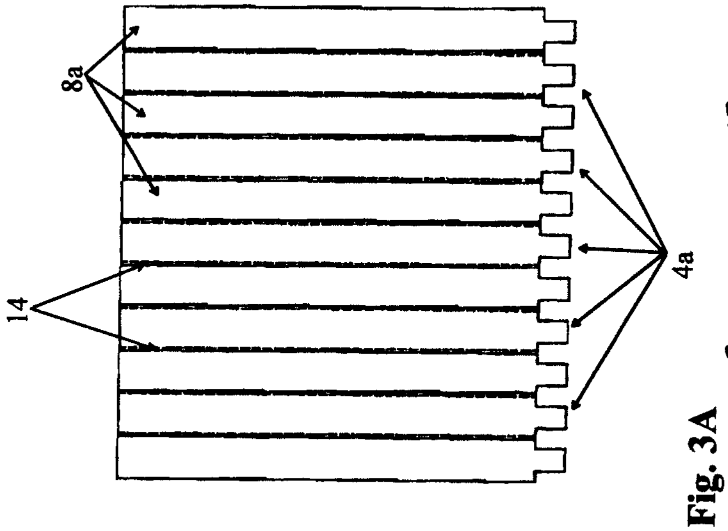
FIG. 3A is a top view showing electrodes arranged according to the invention in which there are overlapping portions.
Figure 3C:
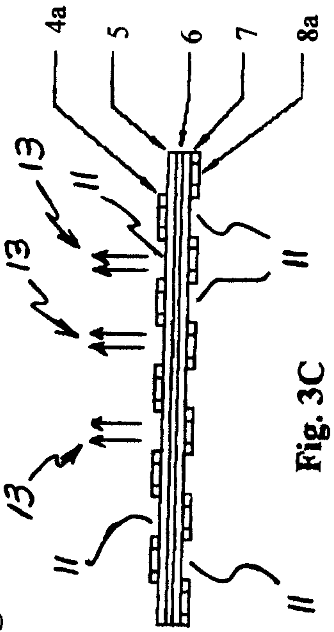

Each electrode 4*a* of the first electrode set 4 may be separated from adjacent electrodes 4*a* in the first set. In doing so, a gap 11 is created between adjacent electrodes 4*a*. Similarly, each electrode 8*a* of the second electrode set 8 may be separated from adjacent electrodes 8*a* in the second set. In doing so, a gap 11 is created between adjacent electrodes 8*a*. FIG. 3C illustrates that the electrodes 4*a* in the first set of electrodes 4 may be staggered relative to the electrodes 8*a* in the second set of electrodes 8. In such an arrangement, the electrodes 8*a* are positioned to emit energy (represented by rays 13 that travels through the gaps 11 between the electrodes 4*a*. As such, an object that is being imaged will be insonified more completely than if only the electrodes 4*a* existed. In doing so, a more complete image of the object may be generated.

FIGS. 2C-2E depict exemplary electrode arrangements according to the present invention. Piezoelectric materials 5, 7 and continuous electrode 6 are omitted from FIGS. 2C-2E for ease of illustration. The orientation of electrodes 4*a* with respect to electrodes 8*a* will be discussed with reference to surface normals 12, which are vectors that are perpendicular to a flat surface, or vectors that are perpendicular to a tangent plane with respect to a particular point on a curved surface. As can be seen in FIGS. 2C-2E, the surface normals 12 which define the surface of the electrodes 8*a* and which also extend through the continuous electrode 6 (not shown) may be arranged in various ways with respect to the surface normals 12 which define the surface of the electrodes 4*a* and also extend through the continuous electrode. For example, in FIGS. 2C and 2E some of the surface normals 12 of the electrode 8*a* are not coincident with surface normals which extend from the electrode 4*a*. In these areas, the electrodes 4*a*, 8*a* are not overlapping. In those areas where electrode 4*a* overlaps with electrode 8*a*, surface normals of electrode 8*a* are coincident with surface normals of electrode 4*a*. Thus, there may be non-coincident normals 12*a* and/or coincident normals 12*b*. With respect to those surface normals extending through electrode 6, in the "overlapping" areas 14 (two of which are called out in FIG. 3*a*), the surface normals of an electrode 8*a* may be coincident and parallel with surface normals of an electrode 4*a*. The "overlapping" areas 14 may correspond to an edge portion of the electrodes 4*a*, 8*a*. The electrodes 4*a*, 8*a* may "overlap" slightly to assure that a complete image of the object can be obtained from the information provided by the generator 10. In one particular embodiment, the "overlapping" areas will be less than 2% of the total surface area of an electrode 4*a*, 8*a*.

An alternative arrangement is shown in FIG. 2D, in which there are no overlapping areas. FIG. 2D shows an electrode 4*a* which does not overlap with the electrode 8*a*. Here, the electrode 4*a* and electrode 8*a* are arranged so that the surface normals 12 are not coincident.

Each electrode 4*a*, 8*a* may be thought of as being part of a small plane wave generator ("SPWG"). A SPWG is comprised of a single electrode 4*a* or 8*a*, the large common electrode 6, and the piezoelectric material 5 or 7 that is between. In use, less than all of the SPWGs of the plane wave generator 10 may be activated at any particular time. For example, to keep the power requirement for a particular time period low, only one SPWG is activated at any particular time during the capture of information, and later, that information can be used to create an image of the object. If the object extends beyond a single electrode 4*a* or 8*a*, the information derived from each SPWG may be sent to a computer that is programmed to combine the information and provide an image of the object via a monitor.

The present invention may act as a plurality of small plane wave generators ("SPWG") that are each addressable. Insonification of an object to be imaged can be performed in segments corresponding to each SPWG in order to take advantage of the lower power requirements of the individual SPWG. Information may be gathered using each segment, and the gathered information may be used to create an image of the object.

The amount of electrical power applied to a single SPWG is less than the power required to activate a full area plane wave generator having the ability to insonify a similar overall area. Consequently, by using a plane wave generator 10 that is in keeping with the invention, the peak power requirement that must be met by the driving circuit may be lower, and the physical size of the driving circuit can be smaller. Specifically, by individually activating individual SPWGs one at a time, the peak power requirement is limited to the power necessary to power each SPWG. This may result in lower peak power requirements because peak power requirements for each SPWG are lower than a prior art plane wave generator 9. The present invention may also allow a larger area insonification device to be used in a system that has a small battery, for example in a portable device such as a personal digital assistant.

Each SPWG may be excited independently from the other SPWGs and at different times. In doing so, the electrical driver circuit used to activate the SPWGs may (a) have a lower peak power requirement, (b) be physically smaller, (c) be less expensive, and (d) be more reliable. With regard to being more reliable, it is normally the case that fewer parts provide a more reliable system. However, in this situation a different result is expected. It is believed that the lower power requirements of the present invention result not only in an ability to use components that are better able to withstand and handle the power needed to generate an image, but the temperature of some components is reduced as well, and it is believed this will result in higher reliability.

Figure 4:
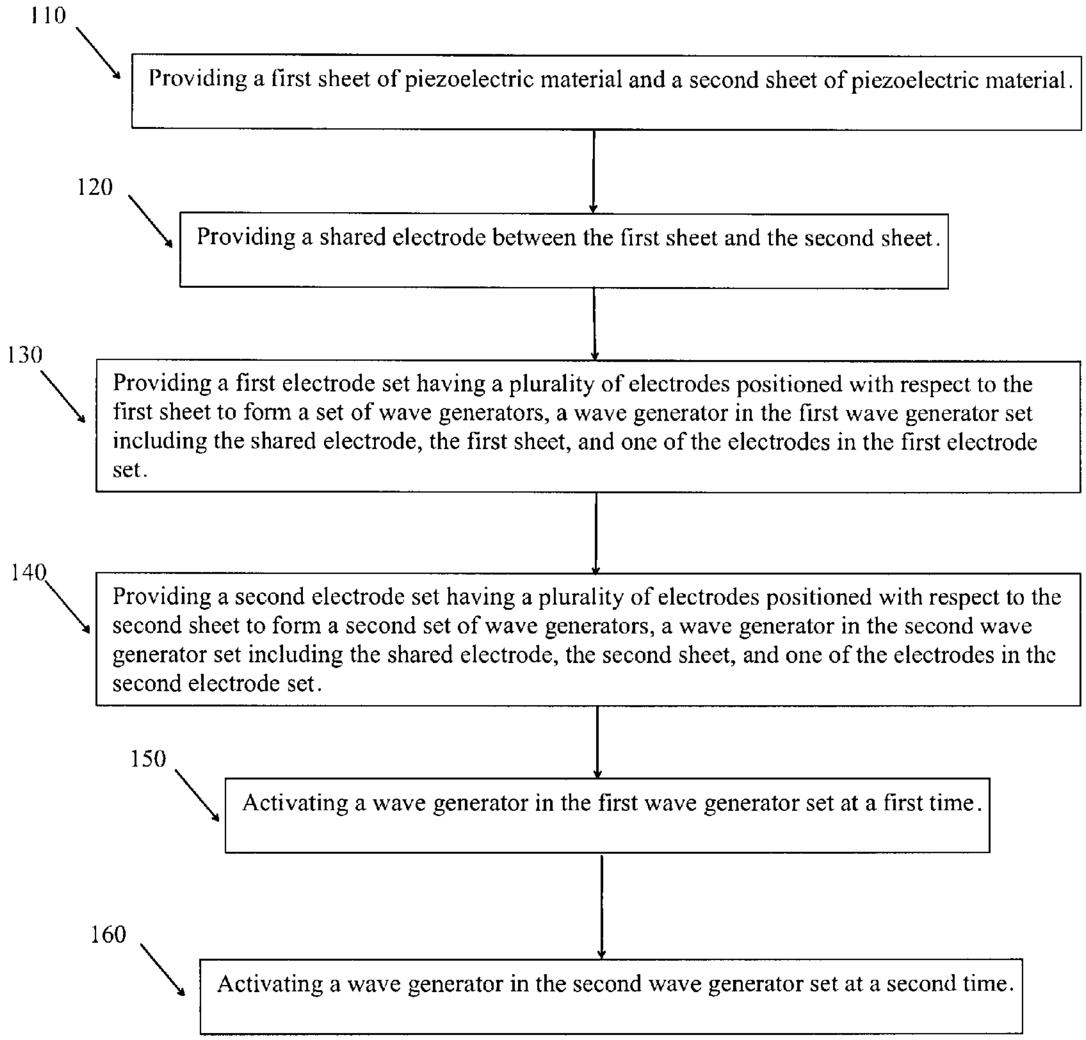
FIG. 4 is a flow chart of a method that is in keeping with the invention.

FIG. 4 depicts a method of insonifying an object using a multiple electrode plane wave generator 10 according to the present invention. A first sheet of piezoelectric material and a second sheet of piezoelectric material may be provided 110. A shared electrode may be placed 120 between the first sheet and the second sheet. A first electrode set may be provided 130 having a plurality of electrodes positioned with respect to the first sheet to form a set of wave generators. A wave generator in the first wave generator set includes the shared electrode, the first sheet, and one of the electrodes in the first electrode set. A second electrode set may be provided 140 having a plurality of electrodes positioned with respect to the second sheet to form a second set of wave generators. A wave generator in the second wave generator set includes the shared electrode, the second sheet, and one of the electrodes in the second electrode set. A wave generator in the first wave generator set may be activated 150 at a first time and a first set of information may be obtained. A wave generator in the second wave generator set may be activated 160 at a second time and a second set of information may be obtained. Then a different one of the wave generators of the first wave generator set may be activated, followed by a different one of the wave generators of the second wave generator set may be activated. This process may be continued until all wave generators have been activated, and information about the object has been obtained as a result of energy emitted from each of the wave generators.

Although the present invention has been described with respect to one or more particular embodiments, it will be understood that other embodiments of the present invention may be made without departing from the spirit and scope of the present invention. Hence, the present invention is deemed limited only by the appended claims and the reasonable interpretation thereof.

What is claimed is:

1. An ultrasonic plane wave generator comprising:

a first sheet of piezoelectric material and a second sheet of piezoelectric material;

a shared electrode between the first sheet and the second sheet;

a first electrode set having a plurality of electrodes positioned with respect to the first sheet to form a first ultrasonic plane wave generator set, wherein an ultrasonic plane wave generator in the first ultrasonic plane wave generator set includes the shared electrode, the first sheet, and one of the electrodes in the first electrode set; and a second electrode set having a plurality of electrodes positioned with respect to the second sheet to form a second ultrasonic plane wave generator set, wherein an ultrasonic plane wave generator in the second ultrasonic plane wave generator set includes the shared electrode, the second sheet, and one of the electrodes in the second electrode set.

2. The ultrasonic plane wave generator of claim 1, wherein adjacent electrodes of the first electrode set are separated from each other.

3. The ultrasonic plane wave generator of claim 2, wherein adjacent electrodes of the second electrode set are separated from each other.

4. The ultrasonic plane wave generator of claim 1, wherein each electrode in the first electrode set has one or more surface normals which define a surface of that electrode, and each electrode in the second electrode set has one or more surface normals which define a surface of that electrode; and wherein a subset of electrodes in the first electrode set are positioned relative to the electrodes in the second electrode set so that surface normals of the subset of electrodes in the first electrode set are not coincident with surface normals of the electrodes in the second electrode set.

5. The ultrasonic plane wave generator of claim 1, wherein each electrode in the first electrode set has one or more surface normals which define a surface of that electrode, and each electrode in the second electrode set has one or more surface normals which define a surface of that electrode; and wherein electrodes in the first electrode set are positioned relative to electrodes of the second electrode set to provide overlapping areas in which surface normals of electrodes in the first electrode set are coincident with surface normals of electrodes in the second electrode set.

6. The ultrasonic plane wave generator of claim 5, wherein surface normals corresponding to an edge portion of electrodes in the first electrode set are coincident with surface normals corresponding to an edge portion of electrodes in the second electrode set.

7. The ultrasonic plane wave generator of claim 6, wherein each electrode of the first electrode set has a surface area, and each electrode of the second electrode set has a surface area, wherein the overlapping areas are less than 2% of the surface area of the first electrode set.

8. The ultrasonic plane wave generator of claim 7, wherein the overlapping areas are less than 2% of the surface area of the second electrode set.

9. The ultrasonic plane wave generator of claim 1, further comprising a platen covering at least one of the first electrode set or the second electrode set.

10. The ultrasonic plane wave generator of claim 9, wherein the platen is polystyrene.

11. The ultrasonic plane wave generator of claim 9, wherein the platen is polymethylmethacrylate.

12. The ultrasonic plane wave generator of claim 9, wherein the platen is a material having the ability to conduct ultrasound.

13. The ultrasonic plane wave generator of claim 1, wherein the piezoelectric material is polyvinylidene fluoride.

14. The ultrasonic plane wave generator of claim 1, wherein the piezoelectric material is polyvinylidene fluoride trifluoroethylene.

15. The ultrasonic plane wave generator of claim 1, wherein the piezoelectric material is a lead zirconium titanate ceramic.

16. The ultrasonic plane wave generator of claim 1, wherein the piezoelectric material is a lead metaniobate ceramic.

17. The ultrasonic plane wave generator of claim 1, wherein at least one of the wave generators in the first ultrasonic plane wave generator set is individually activatable.

18. The ultrasonic plane wave generator of claim 17, wherein at least one of the wave generators in the second ultrasonic plane wave generator set is individually activatable.

19. The ultrasonic plane wave generator of claim 17, further comprising a computer in communication with the ultrasonic plane wave generators of the first ultrasonic plane wave generator set for receiving information from the ultrasonic plane wave generators of the first ultrasonic plane wave generator set.

* * * * *